US008659336B2

(12) United States Patent
Kulmala et al.

(10) Patent No.: US 8,659,336 B2
(45) Date of Patent: Feb. 25, 2014

(54) APPARATUS AND METHOD FOR SYNCHRONISING SIGNALS

(71) Applicant: Renesas Mobile Corporation, Tokyo (JP)

(72) Inventors: Ari Tapani Kulmala, Tampere (FI); Yang Qu, Oulu (FI)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/746,103

(22) Filed: Jan. 21, 2013

(65) Prior Publication Data

US 2013/0314134 A1 Nov. 28, 2013

(30) Foreign Application Priority Data

May 24, 2012 (GB) .................................. 1209121.1

(51) Int. Cl.
*H03K 5/1534* (2006.01)
(52) U.S. Cl.
CPC .................................. *H03K 5/1534* (2013.01)
USPC ........... 327/198; 327/218; 327/225; 327/291; 327/142
(58) Field of Classification Search
CPC ............................. H03K 5/135; H03K 5/1534
USPC ......... 327/155, 141, 142, 162, 185, 198, 199, 327/200, 215–18, 225, 291, 299
See application file for complete search history.

(56) References Cited

U.S. PATENT DOCUMENTS

| 4,615,005 | A | | 9/1986 | Maejima et al. |
| 5,132,990 | A | | 7/1992 | Dukes |
| 5,233,617 | A | * | 8/1993 | Simmons et al. ............. 714/814 |
| 5,410,550 | A | * | 4/1995 | Simmons et al. ............. 714/814 |

(Continued)

FOREIGN PATENT DOCUMENTS

WO   WO 02/14993 A2   2/2002
WO   WO 2007/085532 A1   8/2007

OTHER PUBLICATIONS

Combined Search and Examination Report under Sections 17 and 18(3) dated Sep. 12, 2012, which is issued in a related UK Application No. GB1209121.1 (5 pages).

(Continued)

*Primary Examiner* — Lincoln Donovan
*Assistant Examiner* — Jung H Kim
(74) *Attorney, Agent, or Firm* — Lucas & Mercanti LLP; Robert P. Michal

(57) ABSTRACT

Signal synchronizers synchronize input signals with a clock signal. The input of each synchronizer is connected to a first input and the output of each synchronizer is connected to a second input of a respective first gate arrangement. The first gate arrangements provide an output signal only if there is an input signal on the first input and none on the second input or vice versa. The outputs of each of the first gate arrangements is connected to respective inputs of a second gate arrangement, which provides an output signal if there is a signal on any of its inputs. The output of the second gate arrangement is connected to a third gate arrangement which operates such that the clock signal to the synchronizers is only enabled when there is a change to the state of a signal received at the input of at least one of the synchronizers.

21 Claims, 3 Drawing Sheets

(56) References Cited

U.S. PATENT DOCUMENTS

| | | | |
|---|---|---|---|
| 5,498,988 A * | 3/1996 | Reyes et al. | 327/199 |
| 5,764,710 A | 6/1998 | Cheng et al. | |
| 6,822,478 B2 * | 11/2004 | Elappuparackal | 326/46 |
| 6,989,695 B2 * | 1/2006 | Dike et al. | 327/142 |
| 7,420,391 B2 * | 9/2008 | Pesci | 326/46 |
| 7,808,279 B2 * | 10/2010 | Srivastava et al. | 326/93 |
| 7,944,241 B1 | 5/2011 | Sharma et al. | |
| 7,952,391 B2 * | 5/2011 | Yamaguchi | 326/93 |
| 2003/0016054 A1 * | 1/2003 | Okamoto et al. | 326/80 |
| 2004/0168134 A1 | 8/2004 | Prasad | |
| 2004/0246810 A1 * | 12/2004 | Dike et al. | 365/233 |
| 2010/0156466 A1 | 6/2010 | Freitas | |
| 2011/0234267 A1 * | 9/2011 | Oda | 327/141 |
| 2012/0235020 A1 * | 9/2012 | Decker | 250/208.1 |

OTHER PUBLICATIONS

Texas Instruments OMAP35xx Applications Processor Interrupt Controller (INTC) Technical Reference Manual, Literature No. SPRUFA8, Feb. 2008 (40 pages).

PCT International Search Report and Written Opinion mailed Sep. 5, 2013 which were issued in a related PCT International Application No. PCT/IB2013/054233 (9 pages).

* cited by examiner

APPARATUS AND METHOD FOR SYNCHRONISING SIGNALS

CROSS REFERENCE TO RELATED APPLICATION

This application claims the benefit under 35 U.S.C. §119 (a) and 37 CFR §1.55 to UK Patent Application No. 1209121.1, filed on May 24, 2012, the entire content of which is incorporated herein by reference.

TECHNICAL FIELD

The present invention relates to apparatus and a method for synchronising signals.

BACKGROUND

In electronic circuits, there are very many signals passing round, being moved from one component or element to another, as well as moving within components. In some cases, different parts of the circuit represent different clock domains, being clocked at different clock speeds or timings. In general, control signals and status signals pass from one clock domain to another and/or are passed to some centralised clocking and power state controller module. In general, these status and control signals have to be synchronised. A particular example of this is system state control.

There are in addition very many circuits and devices that use interrupts during operation. In simple terms and as a typical example, an interrupt is an asynchronous signal sent to a processor, such as a central processing unit or CPU, indicating the need for attention. In general, a hardware interrupt causes the processor (typically at the next clock cycle) to save its state of execution and begin execution of an interrupt handler to service the interrupt request. Typically, since no external devices or other parts of the circuit share the same clock as the processor or CPU, all external interrupts, i.e. interrupts that are external to the processor, are said to be asynchronous.

In general, asynchronous interrupts are synchronised to the destination domain (such as a processor) using synchronisers to avoid metastability problems and glitches or erroneous events. A "glitch" is an undesired transition in a signal that occurs before the signal settles to its intended value. For processors, the interrupts are asynchronous events that can interrupt the processor execution or wake it up, for example. Within a processor, there are only a few interrupt lines. However, in larger systems, where there may be several or many components sending interrupts to the processor, an interrupt controller (IC) can be used, typically to handle hundreds of interrupts potentially being passed to the processor. An example of the organisation is shown schematically in FIG. 1. The incoming interrupts 1 are first synchronised in an interrupt synchroniser 2 as required, then fed 3 to the interrupt controller 4, which in turn sends 5 the controlled interrupts to the actual processor or CPU 6.

However, a problem is that the hundreds of interrupts typically come from different clock domains to the interrupt controller. To avoid the metastability issue, all the interrupts are synchronised using free-running clocks. However, in practice, from the hardware perspective, the interrupt values may not change very often. To save power, the processor can be put into an idle mode when not required to be active, and then woken upon some interrupt being asserted. However, the synchroniser clocks for the interrupts cannot be put into an idle mode or their outputs disabled at a time associated with the idle mode of the processor because they are asynchronous events relative to the processor, and also relative to the interrupt controller. Accordingly, conventionally, the interrupt synchronisers and synchroniser clocks continue to run, which consumes significant amounts of power. This is a particular problem for battery-operated devices, including for example mobile wireless devices such as mobile or cell phones (including so-called "smart phones"), personal digital assistants, pagers, tablet and laptop computers, etc., etc.

In U.S. Pat. No. 4,615,005, there is disclosed a data processing apparatus with clock signal control for reduced power consumption. A clock supplying circuit which supplies actuating clock signals to a main CMOS processor of the apparatus is locked and unlocked according to received interrupts, thereby controlling the power consumption of the CMOS processor.

SUMMARY

In a first exemplary embodiment of the invention, there is apparatus for synchronising a plurality of signals, the apparatus comprising:

a plurality of signal synchronisers;

each signal synchroniser having an input and an output and being operable to synchronise an input signal received at the input with a clock signal received at the signal synchroniser to provide a synchronised output signal at the output;

each signal synchroniser being connected to a respective first gate arrangement such that the input of the signal synchroniser is connected to a first input of the first gate arrangement and the output of the signal synchroniser is connected to a second input of the first gate arrangement, the first gate arrangement operating to provide an output signal only if: (i) there is an input signal on the first input and no input signal on the second input of the first gate arrangement or (ii) there is an input signal on the second input and no input signal on the first input of the first gate arrangement; and the outputs of each of the first gate arrangements being connected to respective inputs of a second gate arrangement, the second gate arrangement being operable to provide an output signal if there is an input signal on any of its inputs;

the output of the second gate arrangement being connected to a third gate arrangement to gate the clock signal passed to the signal synchronisers such that the clock signal to the signal synchronisers is only enabled when there is a change to the state of a signal received at the input of at least one of the signal synchronisers.

In a second exemplary embodiment of the invention, there is a method of synchronising a plurality of signals, the method comprising:

for each of a plurality of signal synchronisers which have an input and an output, operating the signal synchroniser to synchronise a signal received at the input with a clock signal received at the signal synchroniser to provide a synchronised output signal at the output; and, each signal synchroniser being connected to a respective first gate arrangement such that the input of the signal synchroniser is connected to a first input of the first gate arrangement and the output of the signal synchroniser is connected to a second input of the first gate arrangement, the first gate arrangement operating to provide an output signal only if: (i) there is an input signal on the first input and no input signal on the second input of the first gate arrangement or (ii) there is an input signal on the second input and no input signal on the first input of the first gate arrangement;

the outputs of each of the first gate arrangements being connected to respective inputs of a second gate arrangement, the second gate arrangement operating to provide an output signal if there is an input signal on any of its inputs; and, the output of the second gate arrangement being connected to a third gate arrangement to gate the clock signal passed to the signal synchronisers such that the clock signal to the signal synchronisers is only enabled if there is a change to the state of a signal provided to at least one of the signal synchronisers, whereby the signal synchronisers are only operated if there is a change to the state of a signal provided to at least one of the signal synchronisers.

There may also be provided a wireless device for wireless communication, the wireless device comprising apparatus as described above.

Further features and advantages of the invention will become apparent from the following description of preferred embodiments of the invention, given by way of example only, which is made with reference to the accompanying drawings.

DETAILED DESCRIPTION

Figure 1:
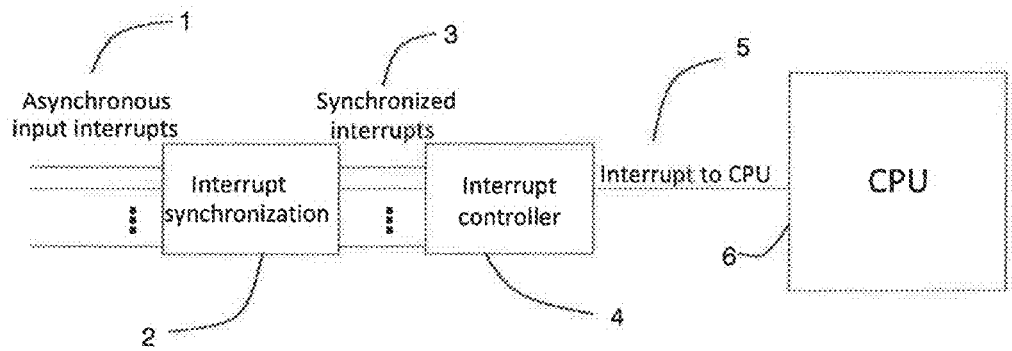
FIG. 1 shows schematically a prior art arrangement for synchronising interrupts and controlling passing of interrupts to a processor.

In an example of an embodiment of the present invention, clock signals to individual signal synchronisers are only enabled whenever there is a change of state of at least one input signal (i.e. at least one input signal changes from being present to not being present, or changes from being not present to being present). This saves power as the signal synchronisers do not need to be powered when there is no change to the state of the input signal. On the contrary, in practice in an embodiment, clock signals are only passed to the signal synchronisers for long enough to allow the change of state to be propagated to the output of the signal synchroniser(s) concerned. By way of example only, this can mean that the signal synchronisers are only enabled and therefore consuming power for a handful of clock cycles, even though a particular input signal may be active for hundreds or thousands of clock cycles.

In practice, in an embodiment, the input signals may be hardware interrupts and the synchronised interrupt outputs at the outputs of the interrupt synchronisers may be passed to an interrupt controller. In another embodiment, the signals may be control signals and/or status signals. A particular example of this is in system state control.

In an embodiment, each of the first gate arrangements comprises an exclusive-OR gate. This provides a simple and effective way of providing the desired functionality of the first gate arrangements, effectively operating to detect a difference between the input and the first gate arrangements. Different gate arrangements may however be implemented.

In an embodiment, the second gate arrangement comprises an OR gate to which the outputs of each of the first gate arrangements are provided as inputs. Again, this provides for a simple implementation, though different gate arrangements may be implemented.

In an embodiment, the third gate arrangement comprises a synchroniser which is operable to synchronise an output of the second gate arrangement with a clock signal. In general terms, in an example of an embodiment of the present invention, there is only this one synchroniser that is always operating with a free running clock, and all of the signal synchronisers are driven by gated clocks so as to operate only when there is a change to the state of a signal received at the input of at least one of the signal synchronisers.

In an embodiment, the third gate arrangement comprises a clock gate which receives the clock signal as a first input and the output of the synchroniser of the third gate arrangement as a clock enable signal to provide said gated clock signal to each of the signal synchronisers.

In an embodiment, at least one of the first gate arrangements is arranged such that no output is provided to the second gate arrangement from said first gate arrangement if the signal received at the input of the signal synchroniser that is connected to said first gate arrangement is a masked signal.

In an embodiment, the apparatus comprises an AND gate which receives as a first input the output of said first gate arrangement and receives as a second input a mask signal for said signal, the output of the AND gate being passed to the second gate arrangement such that the output of said first gate arrangement is passed via the AND gate to the second gate arrangement. Again, this provides for a simple implementation, though different gate arrangements may be implemented.

The present invention has application to many types of devices, apparatus and circuits but has particular application to mobile wireless devices and other devices that are battery-operated and thus for which power consumption is a particular issue. "Wireless devices" include in general any device capable of connecting wirelessly to a network, and includes in particular mobile devices including mobile or cell phones (including so-called "smart phones"), personal digital assistants, pagers, tablet and laptop computers, and content-consumption or generation devices (for music and/or video for example), data cards, USB dongles, etc.

Figure 2:
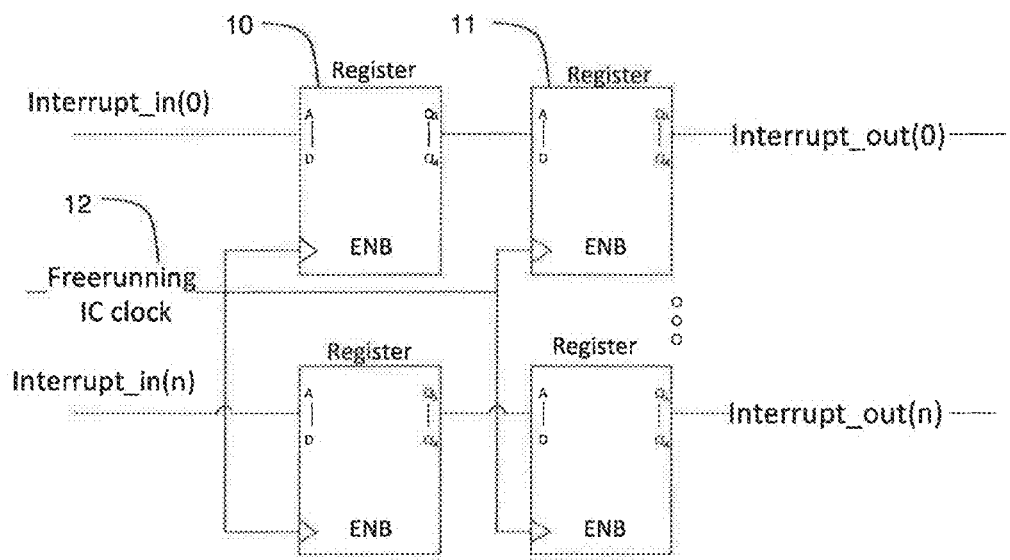
FIG. 2 shows schematically a prior art interrupt synchroniser.

In a well known arrangement for synchronising signals, including as a particular example interrupts, as shown schematically in FIG. 2, two flip-flops 10,11 connected in series are provided for each incoming interrupt Interrupt_in(0)-Interrupt_in(n) (i.e. in this example, there are n interrupts and thus n pairs of serially connected flip-flops 10,11). A free running interrupt control clock signal Freerunning IC clock 12 is provided to each flip-flop 10,11. As is well known, this arrangement avoids metastability problems that arise through use of a single flip-flop, in which the output of the flip-flop is ill defined and random, i.e. it can be unpredictable and oscillate between high and low, if an interrupt arrives in less than a set-up time of the flip-flop or is not held for longer than a hold time of the flip-flop. In the arrangement shown in FIG. 2, the input interrupt Interrupt_in is passed to the data input of the first flip-flop 10. The output of the first flip-flop 10 feeds the data input of the second flip-flop 11. Both flip-flops 10,11 use the same clock input 12. The output Interrupt_out of the second flip-flop 11 will typically be "correct" and synchronised with the Freerunning IC clock 12 after two clocks since the odds of two metastable events occurring back-to-back are in practice very low.

With this known arrangement, each flip-flop 10,11 of each interrupt synchroniser for the n interrupts is required to be constantly running, and therefore powered, as it is not known when a particular interrupt will arrive. In practice, however, the interrupts may not arrive very often and thus in effect power is consumed unnecessarily. This is a particular problem with current, modern devices and apparatus as there may be hundreds of hardware interrupt signals and therefore hundreds of interrupt synchronisers each with their own pair of flip-flops 10,11, each consuming power.

In general terms, in an example of an embodiment of the present invention, the arrangement is such that clock signals to individual interrupt synchronisers are gated or only enabled whenever there is a change to the state of at least one interrupt, which saves power. In general terms, in an example of an embodiment of the present invention, only one synchroniser is always running with a free clock and all the other interrupt synchronisers are driven by gated clocks.

Figure 3:
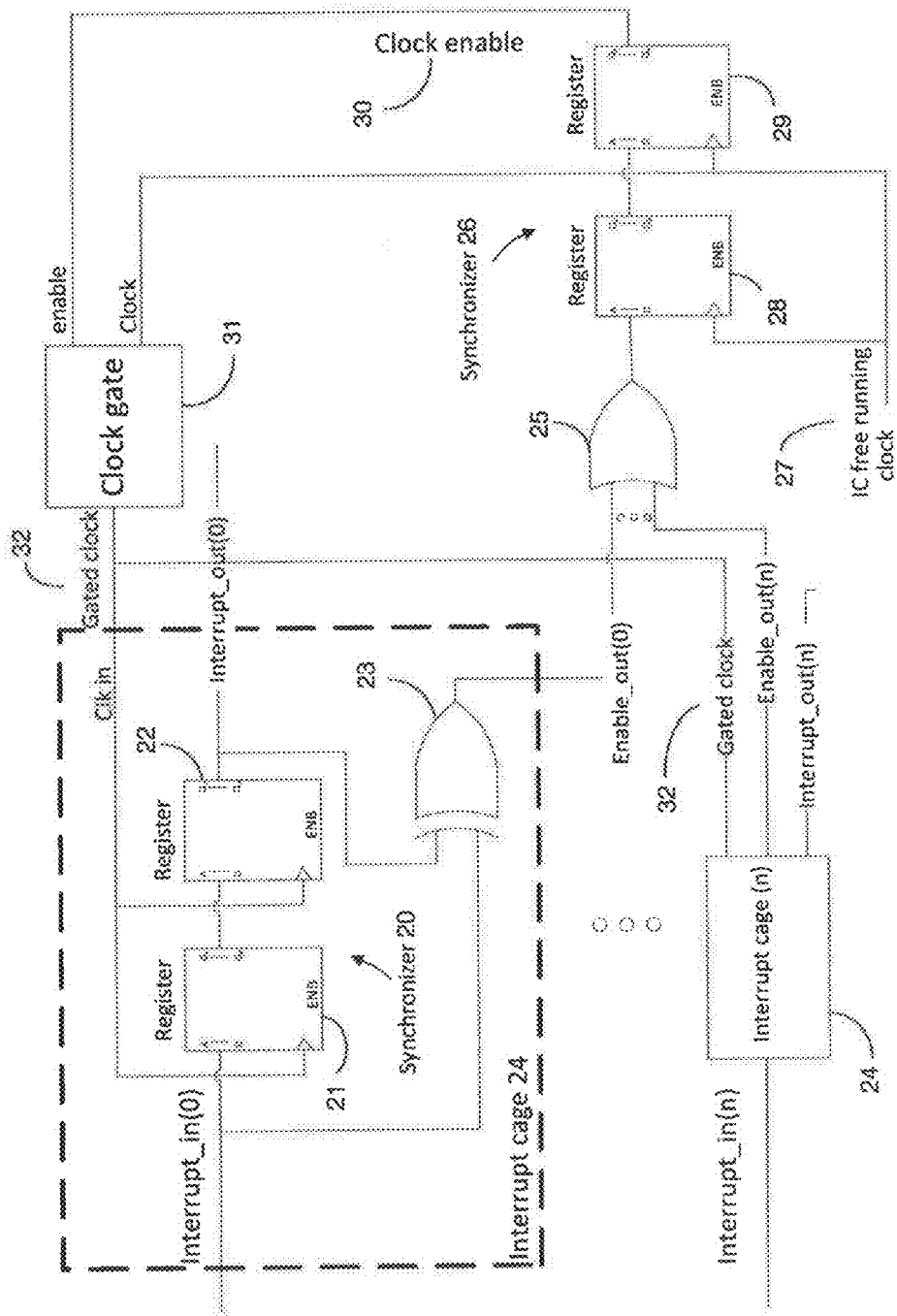
FIG. 3 shows schematic circuit diagram for a first example of an embodiment of the present invention.

FIG. 3 shows a schematic circuit diagram for an example of an embodiment of the present invention. A synchroniser 20 is provided for each incoming interrupt Interrupt_in(0)-Interrupt_in(n), i.e. in this example there are n interrupts and thus n synchronisers 20. Similarly to the prior art of FIG. 2, in this example each synchroniser 20 is formed by two flip-flops 21,22 connected in series, such that there are n pairs of serially connected flip-flops 21,22. In one particular example application, the outputs Interrupt_out of each of the second flip-flops 22 are passed to an interrupt controller (not shown), the operation of which per se is known and discussed briefly above. In each case, the synchroniser 20 formed by the pair of flip-flops 21,22 operates to synchronise the output Interrupt_out with a clock domain relating to the destination of the output Interrupt_out, as will be discussed further below.

For each pair of flip-flops 21,22 for each incoming interrupt Interrupt_in(0)-Interrupt_in(n), the Interrupt_in and the output Interrupt_out of the second flip-flop 22 are fed to respective inputs of an exclusive-OR gate 23. Conceptually, for each Interrupt_in(n), the respective pair of flip-flops 21,22 and exclusive-OR gate 23 can be regarded as providing an "interrupt cage" 24. The exclusive-OR gate 23 in the interrupt cage 24 outputs a HIGH or logical '1' if one or other of the input Interrupt_in and the output Interrupt_out is present or HIGH, and outputs a LOW or a logical '0' if the input Interrupt_in and the output Interrupt_out are the same. The exclusive-OR gates 23 in each of the interrupt cages 24 thus effectively operate to detect a difference between the input Interrupt_in and the output Interrupt_out for that interrupt cage 24. The effect of this therefore is detect a change to the state of an interrupt signal Interrupt_in received at the interrupt input of the interrupt synchroniser 20.

The outputs enable_out(n) of the n exclusive-OR gates 23 of the n interrupt cages 24 are all passed to respective inputs of an OR gate 25. The output of the OR gate 25 is a logical '1' or HIGH if any of its inputs (i.e. the outputs enable_out(n) of the n exclusive-OR gates 23 of the n interrupt cages 24) is a logical '1' or HIGH. Otherwise, the output of the OR gate 25 is a logical '0' or LOW if all of its inputs (i.e. the outputs enable_out(n)) are a logical '0' or LOW. The OR gate 25 therefore operates to detect that at least one of the interrupt inputs Interrupt_in(n) has gone HIGH, i.e. that there has been a change to the state of at least one interrupt, and that therefore it is necessary to enable the clock for the synchronisers 20 in the interrupt cages 24.

The output of the OR gate 25 is passed to another synchroniser 26, which is provided separately of the interrupt cages 24. The synchroniser 26 operates to synchronise the output of the OR gate 25 with an interrupt controller (IC) clock 27 which is free running. The synchroniser 26 in this example is again formed by two flip-flops 28,29 arranged in series, each receiving a clock signal (the IC free running clock 27 in this case) as an input, as known per se and discussed above.

The synchronised output of the synchroniser 26 provides a clock enable signal 30 which is passed as a first input to a clock gate 31. The IC free running clock 27 is passed as a second input to the clock gate 31 to provide the clock signal to the clock gate 31. The clock gate 31 operates to provide an output when the clock enable 30 is HIGH or a logical '1' and no output when the clock enable 30 is LOW or a logical '0', thereby to provide a gated clock signal 32. Taken together with the operation of the OR gate 25, the clock gate 31 enables the clock output 32 whenever the state of at least one of the interrupt inputs Interrupt_in(n) has changed, i.e. at least one of the interrupts has either changed from HIGH or a logical 1 to LOW or a logical 0, or from LOW or a logical 0 to HIGH or a logical 1. The clock gate 31 enables the clock output 32 until the input Interrupt_in and the output Interrupt_out are the same as each other for each of the interrupt cages 24.

The clock signal 32 is provided as the clock input to each of the synchronisers 20 in each of the interrupt cages 24, i.e. as the clock input to each of the flip-flops 21,22 of the synchronisers 20. Thus, a clock signal 32 is only provided to the synchronisers 20 in each of the interrupt cages 24 if at least one interrupt change is being sent. This means that the synchronisers 20, including the flip-flops 21,22 in particular, are only operating when an interrupt change is being sent. If no interrupt change is being sent, then no clock signal is passed to the synchronisers 20 and therefore the synchronisers 20, and the flip-flops 21,22 in particular, do not operate. This immediately saves electrical power. Indeed, the power saving can be relatively large, which is particularly beneficial for battery-operated devices, including for example mobile wireless devices such as mobile or cell phones (including so-called "smart phones"), personal digital assistants, pagers, tablet and laptop computers, etc., etc. As a particular example, a particular interrupt may be active for hundreds or thousands of clock cycles, whilst it is being dealt with or cleared for example by software running on the device or processor concerned. However, during that period, it is not necessary to enable the clock signal 32 to the interrupt cages 24 and instead the clock signal 32 can be gated. It is only necessary to enable the clock signal 32 for long enough to allow a change of state of an interrupt to be propagated to the output of the interrupt synchroniser(s) 22 concerned. It may only take a few clock cycles for the changed value of the interrupt to be transferred from the input to the output of the interrupt cage 24/synchroniser 22. Thus, in such a case, in the present example, the synchronisers 20 may only be powered for a handful of clock cycles, rather than hundreds or thousands of clock cycles.

In detail in operation, assume that, initially in a reset state, everything is reset to zero. In particular, no interrupts are being sent and the inputs to the exclusive-OR gates 23 and the OR gate 25 are all zero. The output of the OR gate 25 is zero and thus initially the clock signal 32 is gated (i.e. no clock signal is output by the clock gate 31). When there is a change in the state of at least one incoming interrupt Interrupt_in(n), the output of the corresponding exclusive-OR gate 23 changes to '1'. That forces the output of the OR gate 25 to '1' and, after synchronisation in the synchroniser 26, the clock enable condition 30 is passed to the clock gate 31 to cause a clock signal 32 to be passed to the synchronisers 20 of all of the interrupt cages 24. As the gated clock 32 is enabled, the synchronisers 20 inside the interrupt cages 24 start to function and the interrupt input values Interrupt_in(n) are fed through their respective synchronisers 20 to the outputs Interrupt_out (n). As long as at least one interrupt input value Interrupt_in (n) and its corresponding interrupt output value Interrupt_out (n) are different, the output of the corresponding exclusive-OR gate 23 is '1', the output of the OR gate 25 is asserted, and thus clocks 32 to the synchronisers 20 of the interrupt cages 24 are enabled. As soon as the interrupt input value Interrupt_in(n) and the corresponding interrupt output value Interrupt_out(n) are the same for all input interrupts (that is, any change to a particular interrupt input value Interrupt_in(n) has propagated through to its corresponding interrupt output value Interrupt_out(n)), the output of all exclusive-OR gates 23 are de-asserted and the output of the OR gate 25 is thus de-asserted, such that the gated clock signal 32 is disabled again by the clock gate 31.

In broad terms, therefore, it will be seen that the single multi-input OR gate 25, the single enable-condition synchroniser 26 for the output of the OR gate 25 and the single clock gate 31 are shared for all of the interrupt cages 24. Only these components need to be constantly clocked, and the synchronisers 20, including the flip-flops 21,22 in particular, in the individual interrupt cages 24 are only operating when an interrupt is being sent. This represents a significant power saving compared to having the synchronisers 20 in all of the interrupt cages 24 powered all the time.

For the interrupt synchronisation scheme discussed above, it is preferred that the interrupts are stable signals (i.e. are level-triggered interrupts) as opposed to pulse-type (i.e. edge-triggered), so that the synchronisation circuit can be used even though it adds some latency to interrupt propagation. With a level-triggered interrupt, a device wishing to signal an interrupt drives the line to its active level, and then holds it at that level until serviced. The device ceases asserting the line when the CPU or some other module at the system level commands it to or otherwise handles the condition that caused it to signal the interrupt in the first place. Therefore, a level-triggered interrupt keeps its state for a relatively long time.

The following may be noted. In the case where the interrupts Interrupt_in(n) are coming from different clock domains, consider that the interrupt inputs come from flip-flops. There are n output ports of exclusive-OR gates 23 in parallel which converge on the single input port of the OR gate 25. In general, it is considered as breaking a synchronisation rule if signals from several clock domains converge without synchronisation. However, in this case, due to the circuit design, when the clock signal 32 is gated (i.e. off or disabled), it is assured that an input to the exclusive-OR gate 23 is stable. In this case, the output of the exclusive-OR gate 23 is only controlled by the interrupt input. The following output port of the OR gate 25 is asserted whenever one of its inputs is a '1'. If the interrupt inputs are glitch-free, it means that there cannot be glitches through the outputs of the exclusive-OR gates 23 or the OR gate 25. Moreover, when the interrupt input Interrupt_in(n) and the interrupt output Interrupt_out(n) become the same, it is known that the clock signal 32 to each of the synchronisers 20 is enabled by the clock gate 31 at that moment. If there are interrupts arriving in parallel at plural synchronisers 20 when the clock signal 32 is enabled, the arrangement of exclusive-OR gates 23 makes sure that the clock signal 32 is enabled until all of the interrupt input values are propagated to their respective interrupt outputs. Thus, in examples of embodiments of the present invention, no issues arise from crossing clock domains when the interrupt input signals Interrupt_in(n) are coming from multiple different clock domains.

It is possible that, as the output port of the OR gate 25 is de-asserted, another interrupt request from another clock domain changes state, which causes a subsequent enable out from an exclusive-OR gate 23 to be active. Then, the output port of the OR gate 25 might go de-asserted to be asserted asynchronously slightly after that. There are three possibilities after that.

First, the enable-condition synchroniser 26 (after the output port of the OR gate 25) samples '1'. Then, clocks are being enabled as soon as possible after synchronisation, or not disabled at all (in case of back-to-back interrupts).

Secondly, the enable-condition synchroniser 26 (after the output port of the OR gate 25) samples '0'. Then the enabling of the clocks will happen one cycle later than with the first possibility.

Thirdly, the enable-condition synchroniser 26 (after the output port of the OR gate 25) samples a changing value, causing timing violation. The first flop 28 of the synchroniser 26 will go into a metastable state. As in standard synchronisers, this needs to be resolved to either '0' or '1', so that the next flop 29 will sample a "clean" value without a timing violation. As the input for the synchroniser 26 is stable, then either one of the first and second scenarios described above will happen.

In essence, the major function of the enable-condition synchroniser 26 for the clock gate 31 is to remove metastability. Even if the input interrupts are not coming directly from the flip-flops 21,22, and even if the circuit that provides inputs to the enable-condition synchroniser 26 for the clock gate 31 is not completely glitch-free, there will not be functional issues. If there are glitches in that part of the circuit, this simply means that the clock signal 32 might be enabled for e.g. one clock cycle even though that is not required for the synchronisers 20 of the interrupt cages 24. This would result in a small power consumption for that one clock cycle which is "wasted" power, but this will not cause functional problems as the metastability is filtered out by the enable-condition synchroniser 26. In any event, in the circuit shown in FIG. 3, there will not be glitches in the interrupt_in lines in because there no interrupts will be generated due to glitches.

From the power consumption point of view, consider as one example only that there are 400 interrupts potentially arriving. In the prior art traditional architecture, as shown in FIG. 2, there would be 400 synchronisers and therefore 800 flip-flops 10,11 always running. In the architecture shown by way of example in FIG. 3, there is only the single enable-condition synchroniser 26 (consisting of two flip-flops 28,29) and the single clock gate 31 (i.e. a total of three logic elements) that are always running and that need the always running IC clock 27. The dynamic power consumption is directly comparable to the amount of free-running sequential elements. It means that during an inactive state, when there are no interrupts changing state, the dynamic power consumed in a prior art arrangement like that of FIG. 2 is in theory roughly 800/3 or 267 times more than that of an architecture like that in FIG. 3. Indeed, the greater the number of interrupts, the more power is saved.

The circuit of FIG. 3 may be modified if needed to have a force control added to the clock gate 31 so that the circuit can be optionally forced to work with a free-running clock, rather than using the clock enable 30 signal provided by the arrangement discussed. When operating in this mode, the circuit would generally have the same properties as the architecture described above with reference to FIG. 2, with typically a few clock cycles less latency in interrupt propagation.

Figure 4:
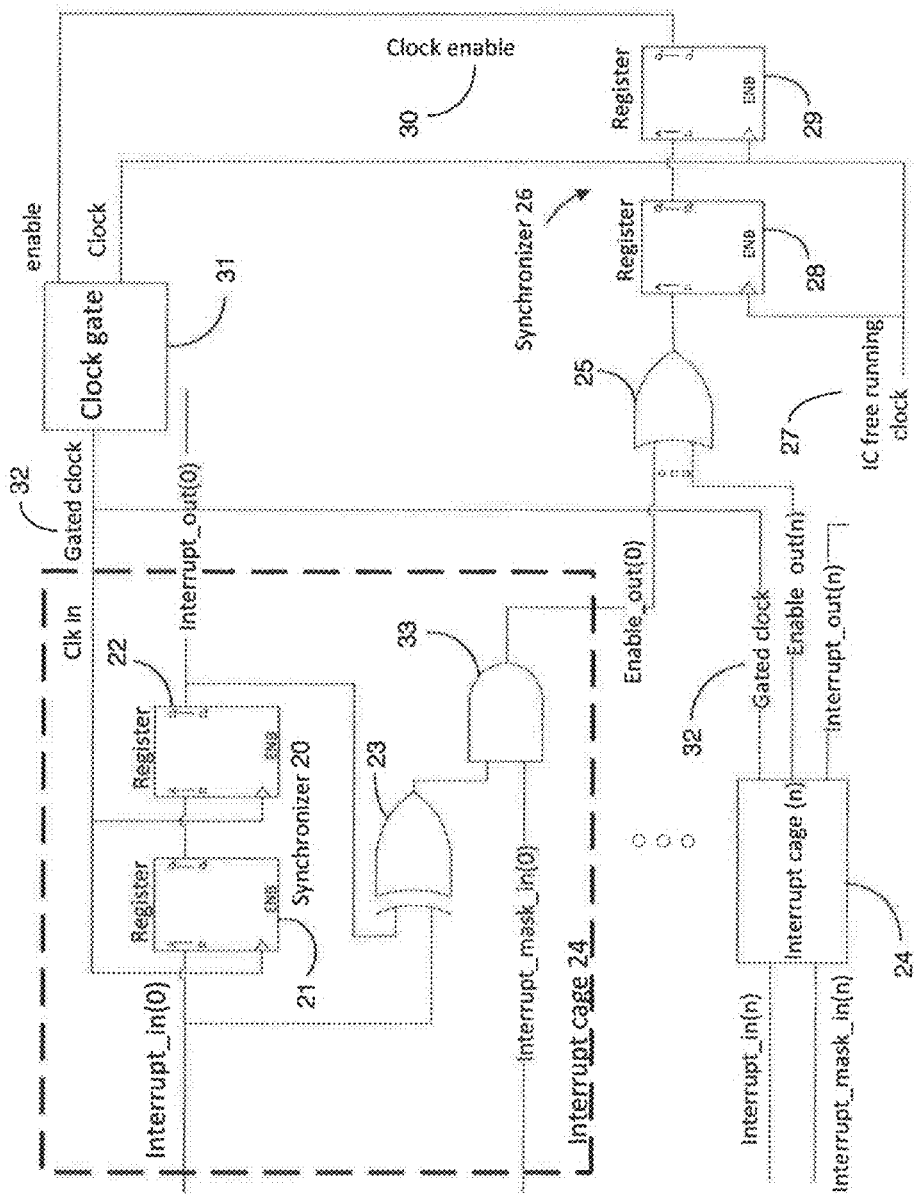
FIG. 4 shows schematic circuit diagram for a second example of an embodiment of the present invention.

Typically, an interrupt controller includes information as to whether an incoming interrupt is masked. A maskable interrupt is a hardware interrupt that may be ignored by setting a bit in an interrupt mask register's bit-mask. If an interrupt is masked, it does not cause an interrupt to be provided to the processor. For further power savings, in a further example of an embodiment of the present invention, this mask information can be used in the interrupt cages 24 if it is available from the interrupt controller. FIG. 4 shows a schematic circuit diagram for an example of an embodiment of the present invention that achieves this. Components and other features that are the same as for the example of FIG. 3 have the same reference numerals and their construction and operation is generally as described above.

As shown in FIG. 4, a respective interrupt_mask_in input signal is added as an input to each of the interrupt cages 24, the interrupt_mask_in input signals being provided by the interrupt controller (not shown). In this example, the mask is active LOW, though it is straightforward to modify the circuit as needed if the mask is active HIGH. In each interrupt cage 24, the output of the exclusive-OR gate 23 is provided as one input to an AND gate 33. The interrupt_mask_in signal is provided as a second input to the AND gate 33. The output of the AND gate 33 is now provided as the output of the interrupt cage 24 to create the enable out from the interrupt cage 24 which is passed as an input, in parallel with the outputs of the AND gates 33 of the other interrupt cages 24, to the OR gate 25. Thus, the mask (i.e. the interrupt_mask_in input signal) controls whether the change in the interrupt line ultimately enables the clock signal 32 as the AND gate 33 only provides an output to the OR gate 25 if both of the inputs to the AND gate 33 are HIGH or a logical '1'.

The output of the interrupt cage 24 can be interpreted as indicating that there is a change in the interrupt that is "interesting", from a CPU point of view say, instead of simply that there is "some" change in the interrupt. If an interrupt is masked, it is not relevant for the processor. Therefore, if the interrupt_in changes, it causes the change in the output of the exclusive-OR gate 23 as previously described. However, as the mask is active in this case, it means that the AND gate 33 does not propagate the enable_out condition. Thus, the interrupt_out state to the OR gate 25 is not updated. If the mask is removed, or during normal operation when no mask is present, the interrupt_mask_in signal provided to the AND gate 33 is HIGH or a logical '1' and thus the information from the exclusive-OR gate 23 about the value change in the interrupt_in is propagated via the AND gate 33 to enable_out to the OR gate 25 similarly as described for the example above with reference to FIG. 3.

It will be understood that not all of the interrupt cages 24 need to have an interrupt_mask_in input signal and the corresponding arrangement of the AND gate 33. For example, one or more of the interrupt cages 24 may be like that shown in detail in FIG. 3 and one or more of the other interrupt cages 24 may be like that shown in detail in FIG. 4.

Ideally, the interrupt_mask_in signal should come directly from a register or logic that does not generate glitches. However, in practice, there is a possibility that mask values are manipulated at the same time that there is a change in the corresponding interrupt_in signals. For example, the mask may be changed to active while there is an interrupt change. This results in short enable signals and as a consequence the clock signal 32 might be unnecessarily enabled. Then, for example, the clock signal 32 might be enabled for one clock cycle and the first flip-flop 21 of the synchroniser 20 in the interrupt cages 24 may already have the changed value but the second flip-flop 22 does not, leading to a lack of correct synchronisation of the interrupt by the synchroniser 20. Typically, however, that should not be a problem as masked interrupts are not of interest. Nevertheless, at a system level, it is preferred that it is guaranteed that it is not a problem if the first flop 21 of the synchroniser 20 has a different value from interrupt_out. For example, it could either be acceptable or it could be handled such that the synchroniser 20 is set/reset correctly when the interrupt input changes for some reason in that case. A typical reason could be for example a reset occurring in the source domain.

In the examples described in detail above, various specific logic gates are discussed, including the exclusive-OR gates 23, the OR gate 25 and the AND gates 33. These specific examples provide a simple and effective way of providing the desired functionality of the various gate arrangements. However, different gate arrangements, including for example different logic gates (such as for example XNOR, NAND, NOR, etc.) may be used in various combinations to achieve the desired functionality, as will be well understood by the person skilled in the art. It may also be noted that the example circuits described above operate the same regardless of whether the incoming interrupts are active HIGH or active LOW, as the circuits effectively rely on detecting a change of state of an interrupt, rather than the level of an interrupt as such.

In addition, the above examples have been described for the particular case of hardware interrupts. However, there are many other cases to which the present invention is applicable, including for example circuits and architectures generally that have inputs from multiple clock domains to some centralised module. This is particularly so for those that have relatively slow response times from a hardware perspective. "Relatively slow" in this context means that an extra latency of a few clock cycles is permitted or can be tolerated. One particular example is system state control. For example, there may be synchronisation of control signals and/or status signals from multiple clock domains to a centralised clocking and power state controller module. These status and control signals need to be synchronised and power can be saved in such a case by employing embodiments of the present invention.

It will be understood that the processor or processing system or circuitry referred to herein may in practice be provided by a single chip or integrated circuit or plural chips or integrated circuits, optionally provided as a chipset, an application-specific integrated circuit (ASIC), field-programmable gate array (FPGA), digital signal processor (DSP), etc. The chip or chips may comprise circuitry (as well as possibly firmware) for embodying at least one or more of a data processor or processors, a digital signal processor or processors, baseband circuitry and radio frequency circuitry, which are configurable so as to operate in accordance with the exemplary embodiments. In this regard, the exemplary embodiments may be implemented at least in part by computer software stored in (non-transitory) memory and executable by the processor, or by hardware, or by a combination of tangibly stored software and hardware (and tangibly stored firmware).

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. An electronic circuit comprising:
   an apparatus for synchronising a plurality of interrupts to a common clock domain, each interrupt being as asynchronous signal indicating a need for attention,
   a processor, and
   an interrupt controller that receives the synchronised interrupts from the apparatus and sends the synchronised interrupts to the processor,
   the apparatus comprising:

a plurality of signal synchronisers, at least one of the signal synchronizers receiving a respective one of the interrupts in a clock domain as an input signal that is different than a clock domain of one of the interrupts being received by another of the signal synchronizers;

each of the signal synchronisers comprising a first flip flop and a second flip flop arranged in series with the first flip flop such that output of the first flip flop is directed to the second flip flop;

the first flip flop of each of the signal synchronisers having an input at which the input signal is received and the second flip flop having an output, each of the signal synchronisers being operable to synchronise the input signal received at the input of the first flip flop with a clock signal of a common clock domain received at an input of both of the first and second flip flops of the signal synchroniser to provide an output signal at the output of the second flip flop that is synchronised to the common clock domain such that the input signals received by all of the signal synchronisers are synchronised to the common clock domain;

each of the signal synchronisers being connected to a respective first gate arrangement such that the input to the first flip flop of the signal synchroniser is also provided to a first input of the first gate arrangement and the output of the second flip flop of the signal synchroniser is connected to a second input of the first gate arrangement, the first gate arrangement comprising an exclusive-OR gate and operating to provide an output signal only if (i) there is an input signal on the first input and no input signal on the second input of the first gate arrangement or (ii) there is an input signal on the second input and no input signal on the first input of the first gate arrangement; and the outputs of each of the first gate arrangements being connected to respective inputs of a second gate arrangement, the second gate arrangement being operable to provide an output signal if there is an input signal on any of its inputs;

the output of the second gate arrangement being connected to a third gate arrangement to gate the clock signal passed to the signal synchronisers such that the clock signal to the signal synchronisers is only enabled when there is a change to the state of a signal received at the input of at least one of the signal synchronisers.

2. Apparatus according to claim 1, wherein the second gate arrangement comprises an OR gate to which the outputs of each of the first gate arrangements are provided as inputs.

3. Apparatus according to claim 1, wherein the third gate arrangement comprises a synchroniser which is operable to synchronise an output of the second gate arrangement with a clock signal.

4. Apparatus according to claim 3, wherein the third gate arrangement further comprises a clock gate which receives the clock signal as a first input and the output of the synchroniser of the third gate arrangement as a clock enable signal to provide said gated clock signal to each of the signal synchronisers.

5. Apparatus according to claim wherein at least one of the first gate arrangements is arranged such that no output is provided to the second gate arrangement from said first gate arrangement if the interrupt received at the input of the signal synchroniser that is connected to said first gate arrangement is a masked signal.

6. Apparatus according to claim 5, comprising an AND gate which receives as a first input the output of said first gate arrangement and receives as a second input a mask signal for said signal, the output of the AND gate being passed to the second gate arrangement such that the output of said first gate arrangement is passed via the AND gate to the second gate arrangement.

7. A method of processing a plurality of interrupts in multiple clock domains in an electronic circuit, each interrupt being an asynchronous signal indicating a need for attention, the method comprising:

synchronising each of the interrupts in the multiple clock domains to a common clock domain using a respective one of a plurality of signal synchronisers, each of the signal synchronisers comprising a first flip flop and a second flip flop arranged in series with the first flip flop such that output of the first flip flop directed to the second flip flop, the first flip flop of each of the plurality of signal synchronisers having an input at which one of the interrupts is received and the second flip flop having an output, each of the signal synchronisers being operated to synchronise the interrupt received at the input with a clock signal of the common clock domain received at an input of both of the first and second flip flops of the signal synchroniser to provide an output signal at the output of the second flip flop that is synchronised to the common clock domain;

each signal synchroniser being connected to a respective first gate arrangement such that the input to the first flip flop of the signal synchroniser is also provided to a first input of the first gate arrangement and the output of the second flip flop of the signal synchroniser is connected to a second input of the first gate arrangement, the first gate arrangement comprising an exclusive-OR gate and operating to provide an output signal only if: (i) there is an input signal on the first input and no input signal on the second input of the first gate arrangement or (ii) there is an input signal on the second input and no input signal on the first input of the first gate arrangement;

the outputs of each of the first gate arrangements being connected to respective inputs of a second gate arrangement, the second gate arrangement operating to provide an output signal if there is an input signal on any of its inputs; and the output of the second gate arrangement being connected to a third gate arrangement to gate the clock signal passed to the signal synchronisers such that the clock signal to the signal synchronisers is only enabled if there is a change to the state of a signal provided to at least one of the signal synchronisers, whereby the signal synchronisers are only operated if there is a change to the state of a signal provided to at least one of the signal synchronisers, the method further comprising directing the output of the signal synchronisers, which are synchronised interrupts, to an interrupt controller, and directing the synchronised interrupts to a processor.

8. A method according to claim 7, wherein the second gate arrangement comprises an OR gate, further comprising providing the outputs of each of the first gate arrangements as inputs to the OR gate.

9. A method according to claim 7, wherein the third gate arrangement comprises a synchroniser, further comprising synchronising an output of the second gate arrangement with a clock signal using the synchroniser of the third gate arrangement.

10. A method according to claim 9, wherein the third gate arrangement comprises a clock gate, further comprising:

providing the clock signal as a first input to the clock gate and the output of the synchroniser of the third gate arrangement as a clock enable signal to the clock gate; and generating, at the clock gate, the gated clock signal that is provided to each of the signal synchronisers based on the input clock signal and the clock enable signal.

11. A method according to claim 7, further comprising configuring at least one of the first gate arrangements such that no output is provided to the second gate arrangement from said first gate arrangement if the interrupt received at the input of the signal synchroniser that is connected to said first gate arrangement is a masked signal.

12. A method according to claim 11, further comprising:
configuring an AND gate to receive as a first input, the output of said first gate arrangement and to receive as a second input, a mask signal for said signal, and passing the output of the AND gate to the second gate arrangement such that the output of said first gate arrangement is passed via the AND gate to the second gate arrangement.

13. A method according to claim 7, wherein the interrupts input to the signal synchronisers are hardware interrupts.

14. A method according to claim 7, wherein the interrupts input to the signal synchronisers are at least one of status signals and control signals.

15. A wireless device for wireless communication, the wireless device comprising the apparatus according to claim 1.

16. Apparatus according to claim 1, wherein the second gate arrangement consists of a single OR gate to which the outputs of all of the first gate arrangements are provided as inputs output of the single OR gate being provided to the third gate arrangement.

17. Apparatus according to claim 16, wherein the third gate arrangement comprises a synchroniser that synchronises the output of the single OR gate with a clock signal.

18. Apparatus according to claim 1, wherein the third gate arrangement comprises a synchroniser having an input and an output and that synchronises a signal received at the input with a clock signal, the output of the second gate arrangement being received at the input of the synchroniser of the third gate arrangement.

19. Apparatus according to claim 18, wherein the third gate arrangement further comprises a clock gate which receives the clock signal as a first input and the output of the synchroniser of the third gate arrangement as a clock enable signal and provides, based thereon, the gated clock signal to each of the signal synchronisers.

20. A method according to claim 7, wherein the second gate arrangement consists of a single OR gate, further comprising:
providing the outputs of all of the first gate arrangements as inputs to the single OR gate; and providing the output of the single OR gate to the third gate arrangement.

21. A method according to claim 20, wherein the third gate arrangement comprises a synchroniser, further comprising synchronising the output of the single OR gate of the second gate arrangement with a clock signal using the synchroniser of the third gate arrangement.

* * * * *